United States Patent [19]

Stengl et al.

[11] Patent Number: 5,188,977
[45] Date of Patent: Feb. 23, 1993

[54] METHOD FOR MANUFACTURING AN ELECTRICALLY CONDUCTIVE TIP COMPOSED OF A DOPED SEMICONDUCTOR MATERIAL

[75] Inventors: Reinhard Stengl, Stadtbergen; Hans-Willi Meul, Bruckmuehl; Wolfgang Hoenlein, Unterhaching, all of Fed. Rep. of Germany

[73] Assignee: Siemens Aktiengesellschaft, Munich, Fed. Rep. of Germany

[21] Appl. No.: 802,811

[22] Filed: Dec. 6, 1991

[30] Foreign Application Priority Data

Dec. 21, 1990 [DE] Fed. Rep. of Germany ....... 4041276

[51] Int. Cl.$^5$ .................... H01L 21/20; H01L 21/465
[52] U.S. Cl. ..................... 437/89; 437/927; 437/958; 445/49; 445/50; 313/309; 148/DIG. 50
[58] Field of Search .............. 445/49, 50, 51; 437/228, 89, 90, 125, 973; 148/DIG. 54; 357/28, 39, 49; 313/305-310

[56] References Cited

U.S. PATENT DOCUMENTS

| | | | |
|---|---|---|---|
| 3,970,887 | 7/1976 | Smith et al. | 445/50 |
| 4,513,308 | 4/1985 | Green et al. | 357/49 |
| 4,758,531 | 7/1988 | Beyer et al. | 437/90 |
| 4,786,615 | 11/1988 | Liaw et al. | 437/89 |
| 4,883,215 | 11/1989 | Goesele et al. | 228/116 |
| 4,901,028 | 2/1990 | Gray et al. | 330/54 |
| 4,986,787 | 1/1991 | Olivier et al. | 437/50 |

FOREIGN PATENT DOCUMENTS

| | | |
|---|---|---|
| 0150885 | 8/1985 | European Pat. Off. . |
| 2-78222 | 3/1990 | Japan ..................... 437/17 |
| WO88/06345 | 8/1988 | PCT Int'l Appl. . |
| WO89/09479 | 10/1989 | PCT Int'l Appl. . |

OTHER PUBLICATIONS

Solid State Electronics, 1974, vol. 17, pp. 155-163, "Fabrication and Some Applications of Large-Area Silicon Field Emission Arrays", by R. N. Thomas et al.
IEEE Transactions on Electron Devices, vol. 36, No. 11, Nov. 1989; "Field Emission from Tungsten-Clas Silicon Pyramids", by Heinz H. Busta et al, pp. 2679-2685.
IEEE Transactions on Electron Devices, vol. 36, No. 11, Nov., 1989; "Modeling and Fabricating Micro-Cavity Integrated Vacuum Tubes", by William J. Orvis et al, pp. 2651-2657.
IEEE Transactions on Electron Devices, vol. 36, No. 11, Nov., 1989; "Semiconductor Fabrication Technology Applied to Micrometer Valves", by Rosemary A. Lee et al, pp. 2703-2708.

Primary Examiner—Olik Chaudhuri
Assistant Examiner—Loc Q. Trinh
Attorney, Agent, or Firm—Hill, Steadman & Simpson

[57] ABSTRACT

For manufacturing an electrically conductive tip composed of a doped semiconductor material, a mask layer is produced on a substrate composed of the semiconductor material. This mask layer contains a material at least at its surface and directly on the substrate whereon the semiconductor material does not grow in a selective epitaxy. An opening wherein the surface of the substrate lies exposed is produced in the mask layer. The electrically conductive tip is produced by a selective epitaxy on the exposed surface of the substrate such that the layer growth in the direction parallel to the surface of the substrate is lower than in the direction perpendicular to the surface of the substrate.

11 Claims, 2 Drawing Sheets

METHOD FOR MANUFACTURING AN ELECTRICALLY CONDUCTIVE TIP COMPOSED OF A DOPED SEMICONDUCTOR MATERIAL

BACKGROUND OF THE INVENTION

The cold field emission from electrically conductive tips having tip radii in the nm range is being increasingly used for electronic components and displays.

For example, a cold cathode triode is known from W. G. Ornis et al, IEEE Trans. ED Vol. 36, Nov. 11, 1989, pages 2651-2657, incorporated herein. In the known component, a silicon tip that forms a cathode is arranged on a silicon wafer. A planar anode is arranged opposite the tip insulated from the cathode. A gate electrode is arranged at the level of the cathode annularly insulated from the cathode and from the anode. When a voltage having the size $V_{AK}$ is applied between the cathode (negative) and the anode (positive), then the cathode emits electrons at field strengths on the order of magnitude of $10^7$ V/cm. This field strength is proportional to $V_{AK}/r$, where r is the tip radius of the cathode. This electron current can be controlled by applying a voltage to the gate electrode.

The rectifier effect of this component arises due to the different geometry of cathode (tip) and anode (plate). The emission field strength is therefore reached at the cathode at a significantly lower voltage $V_{AK}$ than at the planar anode.

Methods for manufacturing emitter tips are known from R. A. Lee et al, IEEE Trans. ED Vol. 36, Nov. 11, 1989, pages 2703-2708 and from R. N. Thomas et al, Solid St. Electr. 1974, Vol. 17, pages 155-163, both incorporated herein. For example, circular regions on an oxidized silicon wafer are thereby etched free with the assistance of a photolithography step such that an oxide spot remains in the middle of the circular region. The oxide spot remaining in the middle of the circle is subsequently undercut with the assistance of anisotropic or isotropic etching. Due to the crystalline structure of the silicon, a tip having corresponding side walls thereby arises, for example <111> or <100>. After the end of the undercutting, the oxide spots detach and the tip is exposed.

In this method, the tip geometry and thus the emissivity are influenced by local fluctuations of the etching rate given the simultaneous manufacture of a plurality of tips.

SUMMARY OF THE INVENTION

It is an object of the invention to specify a method for manufacturing electrically conductive tips that allows an easily controllable setting of the tip radii in the nm range.

According to the method of the invention for manufacturing an electrically conductive tip composed of a doped semiconductor material, a substrate of semiconductor material is provided. A mask layer is produced on the semiconductor material, said mask layer containing material at least adjacent the substrate such that the semiconductor material employed in a following selective epitaxy will not grow thereon. Thereafter, an opening is produced in the mask layer to expose a surface of the substrate. Thereafter, the electrically conductive tip is produced on the exposed surface of the substrate by a selective epitaxy wherein a layer growth occurs in a direction parallel to the surface of the substrate which is lower than a growth rate in a direction perpendicular to the exposed surface of the substrate.

The invention makes use of the fact that a formation of facets at masking structures arises in selective epitaxy, particularly of silicon. A point-shaped tip ground by selective epitaxy thereby arises when the diameter of the opening is smaller than twice the height of the tip.

According to one embodiment of the invention, the mask layer is formed as a triple layer. A first layer of a material on which the semiconductor material does not grow in the selective epitaxy is thereby applied onto the substrate. A second layer of the doped semiconductor material is applied onto the first layer. A third layer of a material on which the semiconductor material does not grow in the selective epitaxy is applied onto the second layer. In the selective epitaxy for forming the conductive tip, the semiconductor material also grows on the side walls of the second layer in this case. The opening in the mask layer is particularly produced with an anisotropic etching process. It lies within the scope of the invention to thereby undercut the second layer by a defined amount under the third layer in an isotropic etching process. The spacing between the semiconductor material grown on the side walls of the second layer and the conductive tip is set via this undercutting.

DESCRIPTION OF THE PREFERRED EMBODIMENTS

Figure 1:
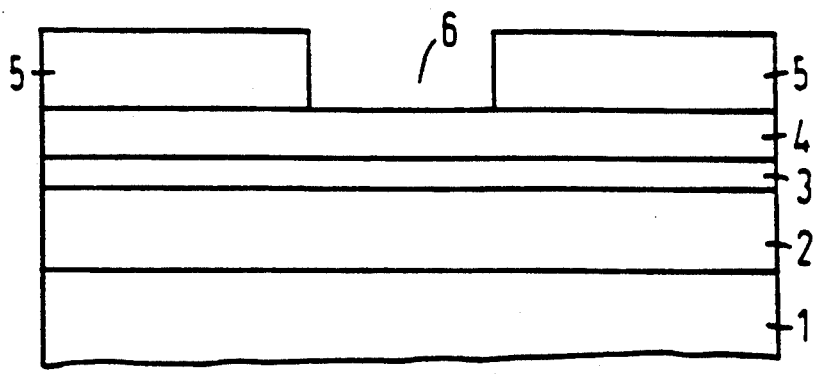
FIG. 1 through 5 show method steps for manufacturing a conductive tip on a semiconductor substrate.

A first insulator layer 2 (see FIG. 1) is applied surface-wide onto a substrate 1 of <100> silicon that is highly doped and n-conductive, for example doped 0.02 $\Omega$cm Sb. The first insulator layer 2, for example, is 0.1 through 0.5 $\mu$m thick and is composed, for example, of thermal or of CVD silicon dioxide. An electrically conductive layer 3 is applied onto the first insulator layer 2. The electrically conductive layer 3 is composed, for example, of n+-doped amorphous silicon and, for example, is 0.1 $\mu$m thick.

A second insulator layer 4 is applied onto the electrically conductive layer 3. The second insulator layer 4, for example, is 0.1 through 0.2 $\mu$m thick. The second insulator 4 is formed, for example, as a double layer composed of a thermal silicon oxide layer that is approximately 50 nm thick and of a LPCVD borophosphorus silicate glass layer that is approximately 0.1 through 0.2 $\mu$m thick. For producing a smooth surface, the borophosphorus silicate glass layer is annealed moist at 900° C.

Figure 2:
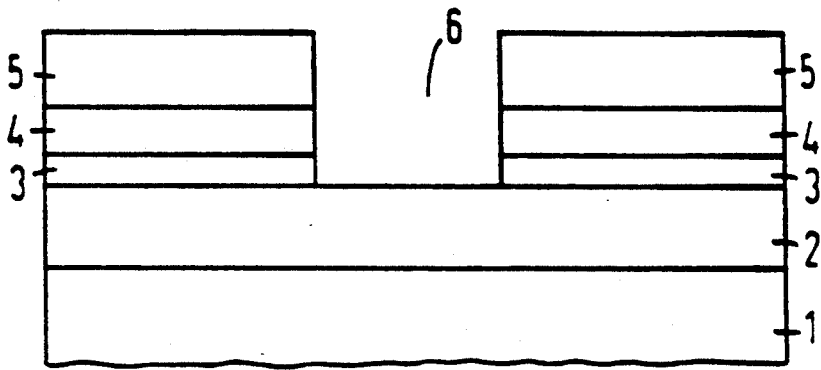

A photoresist layer 5 is whirled onto the second insulator layer 4 and is structured in a photolithography step. Upon employment of the structured photoresist layer 5 as an etching mask, an opening 6 is etched into the second insulator layer 4 and into the electrically conductive layer 3 with a suitable anisotropic etching process (see FIG. 2). The opening 6 has a width w of, for example, 0.6 $\mu$m.

Figure 3:
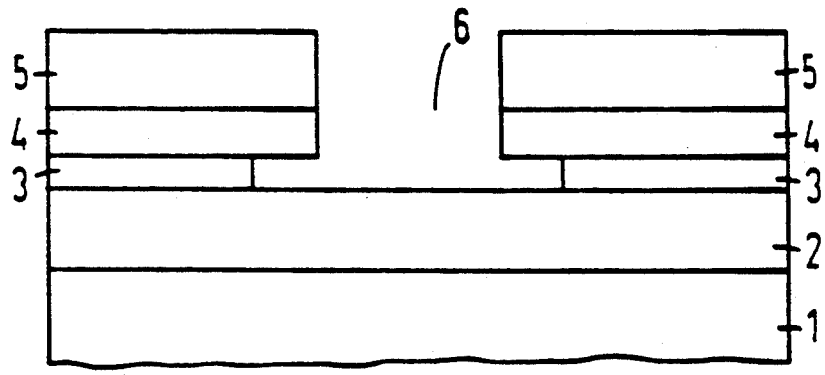

Next, the electrically conductive layer 3 is laterally etched back under the second insulator 4 in wet-chemical fashion (see FIG. 3). Such a wet-chemical, isotropic etching can be easily controlled over the etching duration. The under-etching of the electrically conductive layer 3 under the second insulator layer 4 amounts, for example, to x=0.8 μm.

Figure 4:
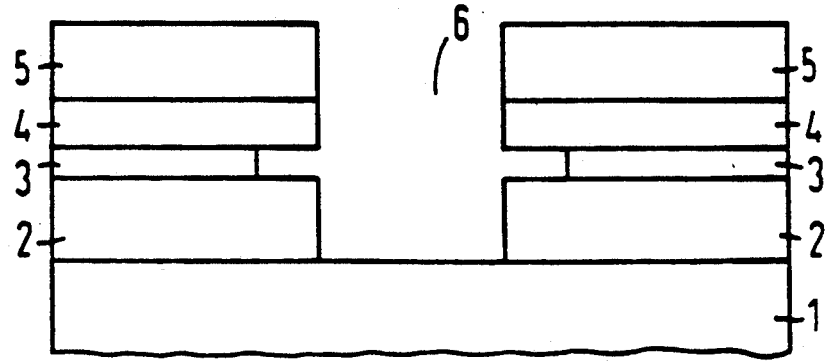

Self-aligned vis-a-vis the electrically conductive layer 3, the first insulator 2 is subsequently anisotropically etched upon employment of the original photoresist layer 5 as an etching mask until the surface of the substrate 1 is laid free (see FIG. 4). The opening 6 is thereby enlarged up to the surface of the substrate 1.

The photoresist layer 5 is removed in the next step. Known cleaning steps for preparing the exposed surface of the substrate 1 for the following, selective silicon epitaxy are then instituted.

The selective silicon epitaxy is subsequently implemented. The following process parameters, for example, are observed in the deposition: HCl having a flow rate of 140 sccm, $SiCl_2H_2$ having a flow rate of 200 sccm, $pH_3$ having a flow rate of 300 sccm and $H_2$ having a flow rate of 60 slm (standard liters per minute) are employed as process gases. The overall pressure amounts to 13.3 hPa. The temperature at the substrate 1 is held at 850° C.

Figure 5:
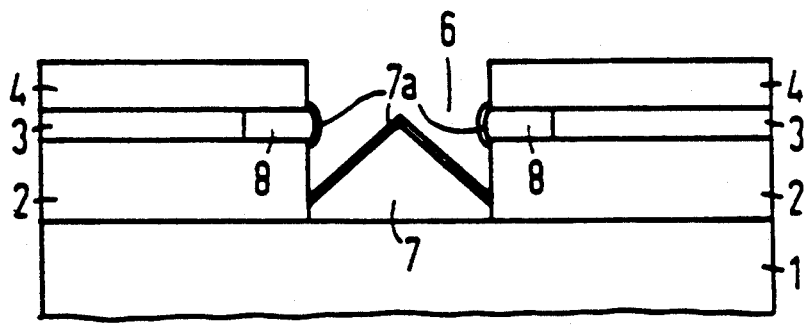

With these process parameters, an in-situ-doped, $n^+$-conductive, pyramidal tip 7 grows on the surface of the substrate 1 exposed in the opening 6 (see FIG. 5). So that a punctiform tip arises, it is critical that the height of the tip 7 is greater than half the width w/2 of the opening 6.

During the selective silicon epitaxy, a polycrystalline silicon structure 8 also grows at the exposed edges of the electrically conductive layer 3 of silicon (see FIG. 5). The thickness of the first insulator layer 2 is adapted to the width w of the opening 6 such that the tip 7 forms a punctiform tip that lies approximately at the level of the polycrystalline silicon structure 8. The spacing between the polycrystalline silicon structure 8 and the tip 7a is then less than half the width w/2 of the opening 6+x, whereby x is the extent of the under-etching of the electrically conductive layer 3 under the second insulator layer 4. Thus, the spacing a can be arbitrarily set on the basis of a designational under-etching x. The spacing a is independent of the resolution or of the adjustment tolerance of a photolithography. By employing a sub-μm lithography for structuring the opening 6 having, for example, w less than 0.3 μm, the tip 7 can be manufactured with a geometry as required for cold cathodes with cut-off voltages below 10 Volts.

The emissivity of the tip 7 given an employment as, for example, a cold cathode, can be improved by a metal layer 7a selectively applied onto exposed silicon surfaces (see FIG. 5). This occurs, for example, with the assistance of a selective metal CVD deposition or with the assistance of a selective silicating method. The metal layer 7a is composed, for example, of $TiSi_2$.

Figure 6:
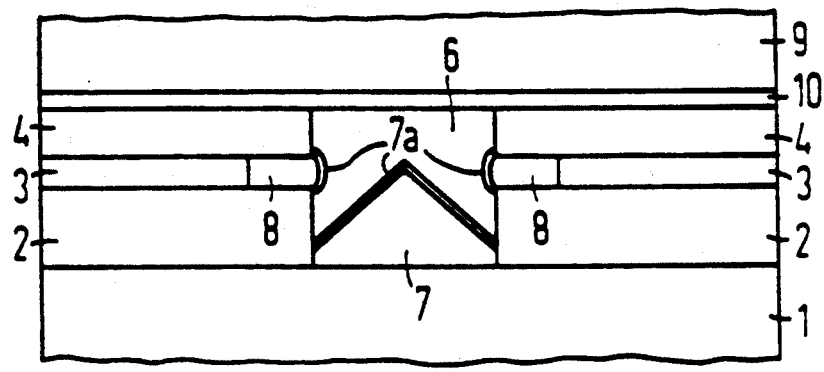
FIGS. 6 and 7 show the manufacture of a cold cathode vacuum tube upon employment of an inventively manufactured conductive tip as a cathode.
Figure 7:
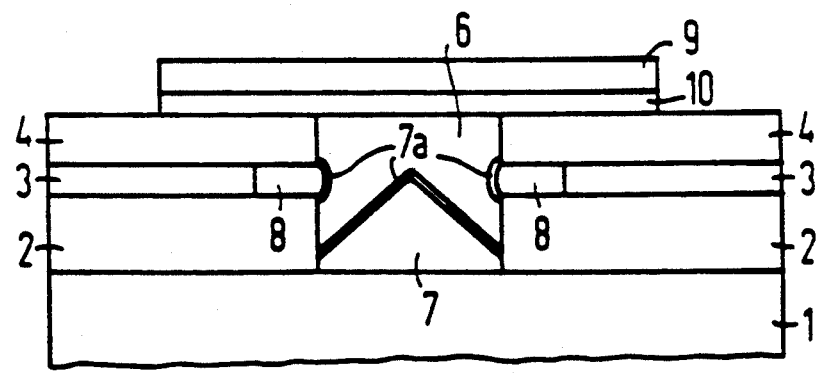

The opening 6 is closed for fabricating a cold cathode vacuum tube (see FIG. 6). This, for example, occurs in that a further substrate 9 is applied onto the second insulator layer 4 in a wafer bonding method as disclosed, for example, by U.S. Pat. No. 4,883,215. The further substrate 9 comprises a smooth $SiO_2$ layer 10 at least at its surface facing toward the second insulator layer 4. A prerequisite for employing the wafer bonding method is that the surfaces to be joined are both extremely planar and are both composed of $SiO_2$. Surfaces suitable for the wafer bonding method are composed, for example, of thermal oxides or of deposited oxides having a high proportion of softeners, as is the case, for example, in borophosphorus silicate glass. The surface of the second insulator layer 4 as produced in this exemplary embodiment satisfies these conditions for wafer bonding. The further substrate 9 is composed, for example, of $n^+$-doped or $p^+$-doped silicon, or is composed of a light-transmissive, conductive material for displays.

It is especially advantageous to implement the wafer bonding in an $O_2$ atmosphere. An annealing step is necessary in the bonding. In this annealing step, silicon surfaces adjoining the opening 6 are oxidized in a pure $O_2$ atmosphere. A vacuum having a residual gas pressure that corresponds to the vapor pressure of $SiO_2$ is formed during this oxidation.

The cold cathode vacuum tube is finished by grinding the further substrate 9 down and by structuring the further substrate 9 on the basis of a non-critical photo-technique.

In the finished cold cathode vacuum tube, the tip 7 forms the cathode, the electrically conductive layer 3 with the polycrystalline silicon structures 8 forms the control electrode, the further substrate 9 forms the anode, and the opening 6 forms the interior of the tube.

By applying the method of the invention, the spacing between the tip of the cathode and the anode—which represents an important parameter for the electron emission—is defined only via the height of the tip 7. This height can be set extremely precisely via surface reactions at temperatures around 850° C.

Figure 8:
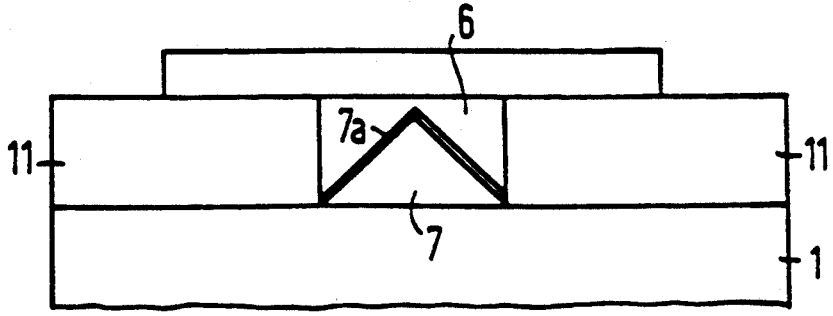
FIG. 8 shows a compact embodiment of a cold cathode vacuum tube.

A simplified embodiment of the invention provides that only a single insulating layer 11 is provided instead of the first insulating layer 2, the electrically conductive layer 3, and the second insulating layer 4 (see FIG. 8). For example, the single insulating layer 11 is composed of a thermal $SiO_2$ that is applied in a thickness H of, for example, 1 μm that is greater than half the width w/2 of, for example, 0.3 μm of the opening 6. The same reference characters a in FIGS. 1 through 7 have been employed in FIG. 8 for identical parts. This embodiment allows the manufacture of cold cathode emitter fields having extremely high packing density.

The manufacturing method of the invention that has been set forth here, with reference to an n-doped silicon substrate, can likewise be implemented on the basis of a p-doped silicon substrate.

Although various minor changes and modifications might be proposed by those skilled in the art, it will be understood that we wish to include within the claims of the patent warranted hereon all such changes and modifications as reasonably come within our contribution to the art.

We claim as our invention:

1. A method for manufacturing a cold cathode vacuum tube, comprising the steps of:
   providing a substrate as a layer of semiconductor material;
   providing a first layer on a surface of the semiconductor material, said first layer being formed of a material on which semiconductor material employed in a subsequent selective epitaxy will not grow;
   providing a second layer of doped semiconductor material on the first layer;
   applying a third layer onto the second layer, said third layer being formed of a material on which the semiconductor material used in said subsequent selective epitaxy will not grow;
   producing in the first, second, and third layers an opening so that a portion of the surface of the substrate is exposed;

producing an electrically conductive tip on the exposed surface portion of the substrate by said selective epitaxy employing said semiconductor material, and wherein a layer growth in a direction parallel to the surface of the substrate is lower than a layer growth in a direction perpendicular to the surface of the substrate, and wherein during said selective epitaxy, a semiconductor material also grows at side walls of said doped semiconductor material second layer; and providing a further semiconductor material layer over said third layer and covering said opening.

2. A method according to claim 1 including the step of under-etching said second layer so that during said selective epitaxy, semiconductor material grows in a gap between the first and third layers.

3. A method according to claim 2 including the steps of:

producing the opening in the first, second, and third layers by anisotropic etching;

when producing the opening in the first, second, and third layers, the second layer is under-etched by a defined amount in an isotropic etching process; and growing the conductive tip to a height such that a height of the tip from the surface portion of the substrate and a spacing between a middle of the second layer and the surface portion of the substrate are substantially the same.

4. A method according to claim 1 wherein a metal layer is selectively applied onto the conductive tip.

5. A method according to claim 1 wherein an $SiO_2$ layer having a smooth surface is produced at a surface of the third layer, said further semiconductor material layer being applied onto said $SiO_2$ layer by wafer bonding, and at least a side of said further layer facing toward said $SiO_2$ layer being provided with a smooth surface.

6. A method according to claim 5 wherein said wafer bonding is implemented in a pure $O_2$ atmosphere.

7. A method according to claim 1 wherein said second layer forms a control electrode, said further semiconductor layer forms an anode, and said tip forms a cold cathode.

8. A method according to claim 1 wherein said selective epitaxy occurs by deposition from a vapor phase.

9. A method according to claim 8 wherein silicon is employed as the semiconductor material for the substrate and for the selective epitaxy.

10. A method according to claim 9 wherein the selective epitaxy is implemented by use of $H_2$, $HCl$, and $SiCl_2H_2$ as process gases.

11. A method according to claim 10 wherein a flow rate for the $H_2$ is between 10 slm and 200 slm, a flow rate for the $HCl$ is between 0 slm and 1 slm, a flow rate for the $SiCl_2H_2$ is between 30 sccm and 1000 sccm, a temperature of the substrate is between 800° C. and 1000° C., and an overall pressure of the process gases is between 133 Pa and 5333 Pa.

* * * * *